United States Patent [19]

Fortuna

[11] Patent Number: 4,990,107
[45] Date of Patent: Feb. 5, 1991

[54] INTEGRATED CIRCUIT MODULE CONNECTOR ASSEMBLY

[75] Inventor: Jon A. Fortuna, Mechanicsburg, Pa.
[73] Assignee: AMP Incorporated, Harrisburg, Pa.

[21] Appl. No.: 439,210
[22] Filed: Nov. 17, 1989
[51] Int. Cl.[5] ............ H05K 1/00
[52] U.S. Cl. ............ 439/637; 439/59
[58] Field of Search ............ 439/152-160, 439/629-637, 325-328, 65, 59-62

[56] References Cited

U.S. PATENT DOCUMENTS

| | | | |
|---|---|---|---|
| 3,150,906 | 9/1964 | Chambon et al. | 439/157 |
| 3,172,717 | 3/1965 | Clewes | 439/637 |
| 3,609,547 | 9/1971 | Slusser | 439/160 |
| 3,617,992 | 11/1971 | Rucklemann | 439/631 |
| 4,701,002 | 10/1987 | Mouissie | 439/630 |
| 4,737,120 | 4/1988 | Grabbe | 439/326 |

FOREIGN PATENT DOCUMENTS

| | | | |
|---|---|---|---|
| 2305912 | 10/1976 | France | 439/637 |

*Primary Examiner*—David L. Pirlot

[57] ABSTRACT

An electrical connector assembly for providing interconnections between a plurality of contact pads (22) on a daughter board (20) and contact areas (24) on a mother board (26). The assembly includes an elongated housing (28) with a daughter board receiving cavity (38) along its longitudinal axis (30) and a plurality of contact receiving cavities (36) which are substantially planar and parallel to each other arranged at a slight angle with respect to a normal to the axis (30). The contact receiving cavities (36) intersect the board receiving cavity (38) and within each of them there is disposed a contact member (40) having a contact portion (42) and a contact leg (44) on opposite sides of the board receiving cavity (38). The contact leg (44) extends through the bottom surface (34) of the housing (28) into contact with a contact area (24) on the mother board (26). The contact members (40) alternate within the contact receiving cavities (36) so that insertion of a daughter board (20) causes compressive stress to be applied to the housing (28) through the contact legs (44).

7 Claims, 8 Drawing Sheets

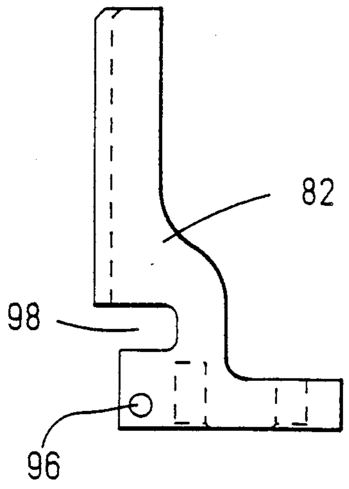
FIG. 14A
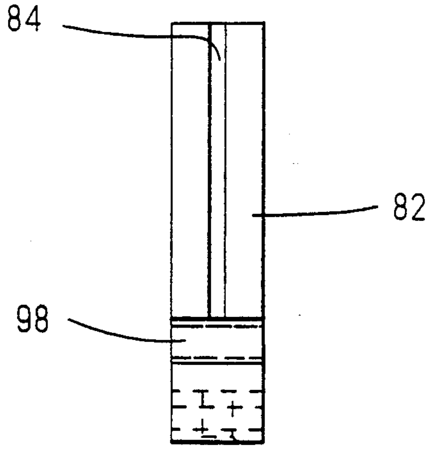
FIG. 14B
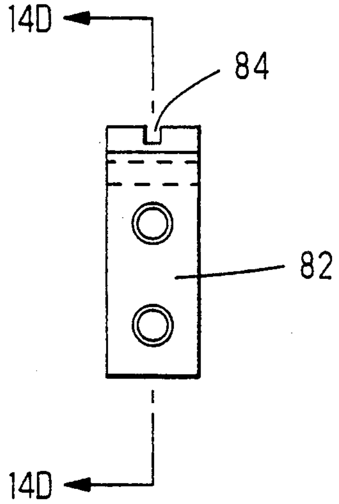
FIG. 14C
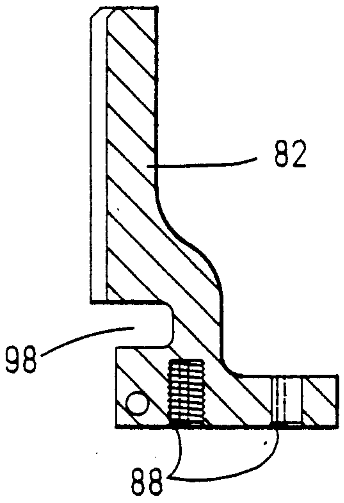
FIG. 14D
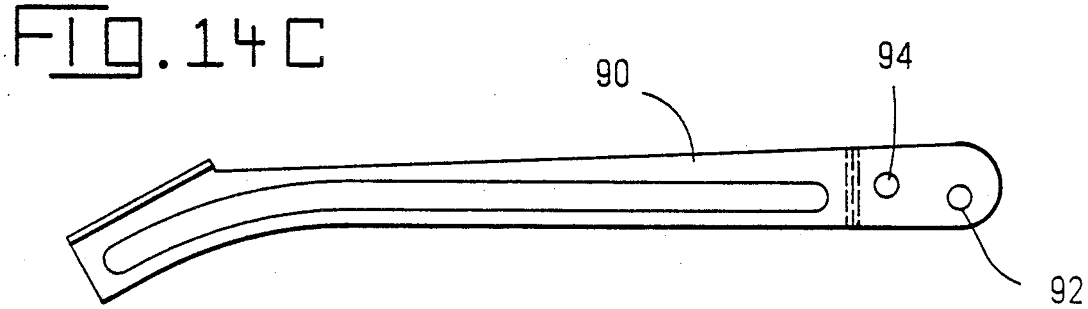
FIG. 15
FIG. 14C
90
94

INTEGRATED CIRCUIT MODULE CONNECTOR ASSEMBLY

BACKGROUND OF THE INVENTION

This invention relates to electrical connectors and, more particularly, to an assembly for providing interconnections between an integrated circuit module and a printed circuit board.

In recent years, a so-called single in line memory module (SIMM) has become increasingly popular. Such a module, or board, is used primarily to carry interconnection support for a series of memory chips and its dimensions are typically about 1/16" thick, 4" in length, and ½" or more in width. Typically, a plurality of these modules are supported on, and electrically connected to, a single relatively large printed circuit board. In this configuration, the modules are known as "daughter boards" and the large printed circuit board is referred to as a "mother board". Contact pads are typically positioned on both surfaces of the daughter board, along one of the long edges, with each contact pad being shorted to the pad just opposite it on the other surface, permitting typical SIMM mating connectors mounted on the mother board to use a contact member which simultaneously applies normal forces to both sides of the daughter board, thereby making electrical contact to both of the shorted contact pads. Such a connector is disclosed, for example, in U.S. Pat. No. 4,737,120.

A number of problems have been encountered with presently available SIMM connectors, including warping of the daughter board, difficulty of insertion and removal of the daughter board, and difficulty of withstanding vibration without producing fretting corrosion. Accordingly, it is an object of this invention to provide a connector assembly which is not susceptible to these problems.

Recently, new modules have been introduced having increased memory capacity and which in fact may contain thereon a complete computer of the IBM XT class. Such a module may require electrically unique (separate) contact pads on both surfaces. It is therefore another object of this invention to provide a connector assembly capable of establishing separate connections to contact pads on both sides of a module.

A module, or daughter board, as described above may contain as many as 100 contact pads per side, for a total of up to 200 contact pads. The insertion of such boards into mating connectors requires a substantial insertion force. It is therefore a further object of this invention to provide a connector assembly of the so-called zero insertion force type. The term "zero insertion force" is in actuality a misnomer, since force must be applied at some time. However, the force is not applied directly to the module but rather through an intermediate member.

From past experience, it has been found that the industry does not maintain specified board thickness limits. It is therefore yet another object of this invention to provide a connector assembly capable of accepting boards over a relatively large range of thicknesses.

When installed, the boards described above will be only one of many circuit components. Densely packed electronic components generate substantial amounts of heat which must be removed by an induced air flow. Therefore, the structure comprising the connector assembly must be small, must not obstruct the air flow, and because utilization is in large volumes, must be inexpensive. However, the connector assembly must be capable of withstanding the stresses generated by 200 contacts, each of which applies a 150 gram nominal mating force, while operating in typical environments of 60° C. for a minimum life of 15 years. Accordingly, it is still a further object of this invention to satisfy these requirements by providing a connector assembly of minimal size without requiring the use of expensive materials.

SUMMARY OF THE INVENTION

The foregoing, and additional, objects of this invention are attained by an electrical connector assembly which provides electrical connections between a plurality of contact pads on a first board and respective ones of a plurality of contact areas on a second board. The assembly comprises an elongated dielectric housing having a longitudinal axis, a top surface and a bottom surface, the housing being formed with a plurality of contact receiving cavities extending from the top surface toward the bottom surface and transverse to the axis, the housing being further formed with a first board receiving cavity extending from the top surface toward the bottom surface along the axis and intersecting the contact receiving cavities. A plurality of contact members are disposed in respective ones of the plurality of contact receiving cavities, each of the contact members including a contact leg extending through a respective aperture in the bottom surface of the housing, a contact portion for engaging one of the plurality of contact pads, and a spring portion between the contact leg and the contact portion, the contact leg being on the opposite side of the axis from the contact portion when the contact member is disposed in a contact receiving cavity. The plurality of contact members are so oriented in the contact receiving cavities that insertion of the first board into the first board receiving cavity results in compressive stress being induced in the housing through the contact legs, since materials are typically stronger when placed in compression rather than when placed in tension.

In accordance with an aspect of this invention, alternate contact members are oppositely oriented.

In accordance with another aspect of this invention, the contact receiving cavities are substantially planar, are parallel and are angled relative to the longitudinal axis so that the contact legs of pairs of adjacent contact members are positioned substantially in opposition across the axis.

In accordance with still another aspect of this invention, each of the contact members further includes a locking leg extending through a respective aperture in the bottom surface of the housing, each of the locking legs being offset after insertion of the respective contact member in the respective contact receiving cavity to inhibit removal of the contact member therefrom.

In accordance with yet another aspect of this invention, the connector assembly further includes means for mounting the housing on the second board with the contact legs of the contact members in engagement with respective ones of the contact areas.

In accordance with a further aspect of this invention, the first board is formed with a slot extending from an edge transverse to the direction of movement of the first board into and out of the first board receiving cavity and the connector assembly further comprises a lever arm mounted on the housing adjacent an end of the first board receiving cavity for pivoting movement about an axis transverse to the plane of the first board, the lever arm including a pin projecting from the lever arm parallel to the pivot axis and adapted to cooperate with the slot for insertion/removal of the first board upon pivoting movement of the lever arm.

BRIEF DESCRIPTION OF THE DRAWINGS

The foregoing will be more readily apparent upon reading the following description in conjunction with the drawings in which like elements in different figures thereof have the same reference numeral and wherein:

FIGS. 14A–14D illustrate a latch support for the connector assembly shown in FIGS. 13A and 13B; and FIG. 15 is a plan view of an illustrative lever arm.

DETAILED DESCRIPTION

Figure 1:
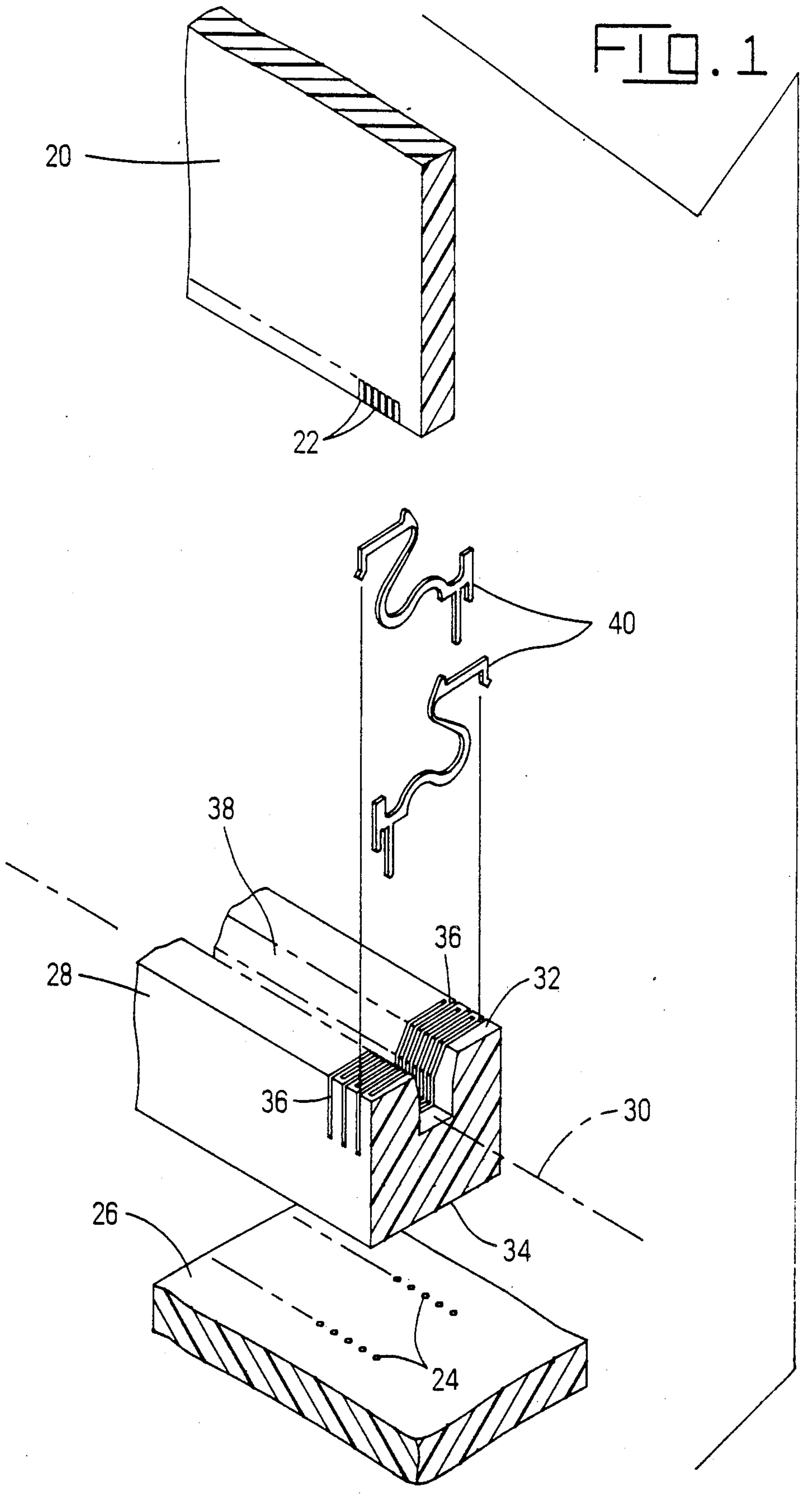
FIG. 1 is an exploded perspective view showing a portion of the inventive connector assembly.

Referring to the drawings, FIG. 1 is an exploded perspective view showing a portion of the inventive connector assembly as well as a portion of the daughter board and the mother board, which figure is useful for an understanding of the principles of this invention. Thus, as shown in FIG. 1, a daughter board 20 has an array of contact pads 22 along an edge thereof. Although the contact pads 22 are shown only on one surface of the daughter board 20, contact pads are typically also provided on the opposite surface of the board 20 along the same edge as the contact pads 22 and in opposition thereto across the thickness of the board 20. The contact pads 22 can be shorted to opposing pads on the other surface of the board 20 or they can be separate, depending upon the number of connections that need to be made to the circuitry mounted on the board 20.

The connector assembly according to this invention functions to provide electrical connections between the contact pads 22 on the daughter board 20 and respective ones of a plurality of contact areas 24 on a mother board 26. The contact areas 24 are disposed in a regular array corresponding to the contact pads 22 on the daughter board 20. The contact areas 24 may take the form of plated apertures in the mother board 26.

The connector assembly according to this invention includes an elongated housing 28 formed of dielectric material. The housing 28 has a longitudinal axis, illustrated at 30, a top surface 32 and a bottom surface 34. The housing 28 is formed with a plurality of contact receiving cavities 36 which extend from the top surface 32 toward the bottom surface 34. The contact receiving cavities 36 are generally planar and are slightly angled with respect to a normal to the longitudinal axis 30. The housing 28 is further formed with a daughter board receiving cavity 38 extending from the top surface 32 toward the bottom surface 34. The board receiving cavity 38 extends along the axis 30 and intersects the contact receiving cavities 36.

Figure 8:
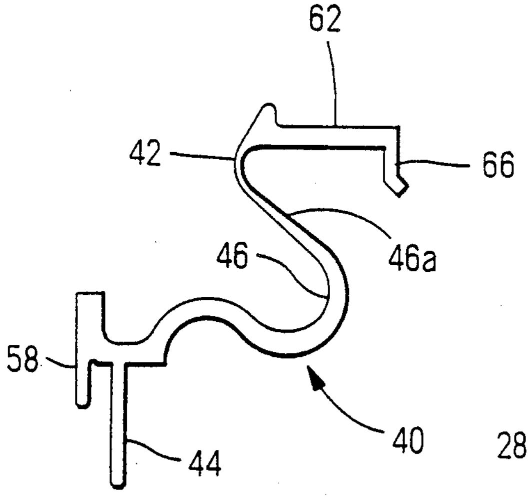
FIG. 8 is a plan view of an illustrative contact member.
Figure 9:
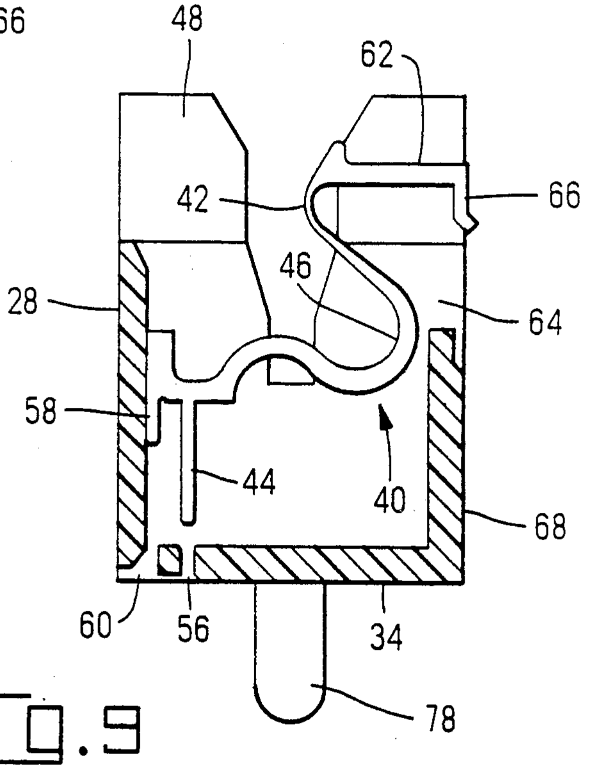
FIG. 9 is a view showing the contact member of FIG. 8 at a first step in its installation into a respective contact receiving cavity.

Disposed within each of the contact receiving cavities 36 is a contact member 40. As is best shown in FIG. 8, the contact member 40 includes a contact portion 42, a contact leg 44, and a spring portion 46 between the contact portion 42 and the contact leg 44. As will be apparent after reading the following description, the contact portion 42 is adapted for engaging one of the contact pads 22 and the contact leg 44 is adapted to be inserted into one of the plated apertures comprising a contact area 24. Thus, the contact member 40 provides the electrical connection between a contact pad 22 and a respective contact area 24. Additionally, the contact members 40 are so oriented in their respective contact receiving cavities 36 that, upon insertion of the daughter board 20 in the board receiving cavity 38, compressive stress is induced in the housing 28 through the contact legs 44.

Figure 2:
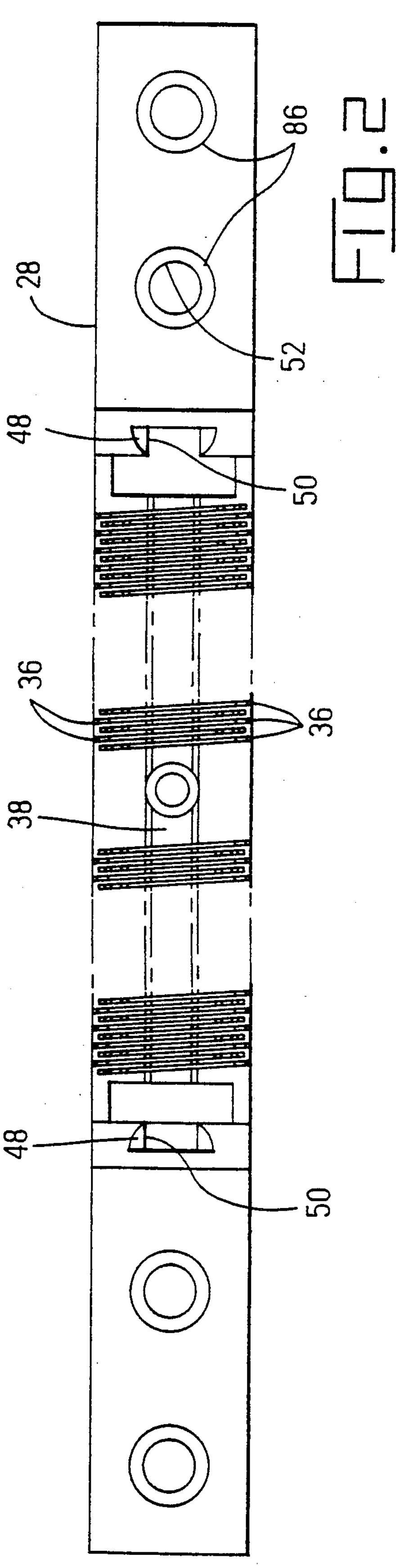
FIG. 2 is a top plan view of the connector assembly housing.
Figure 3:
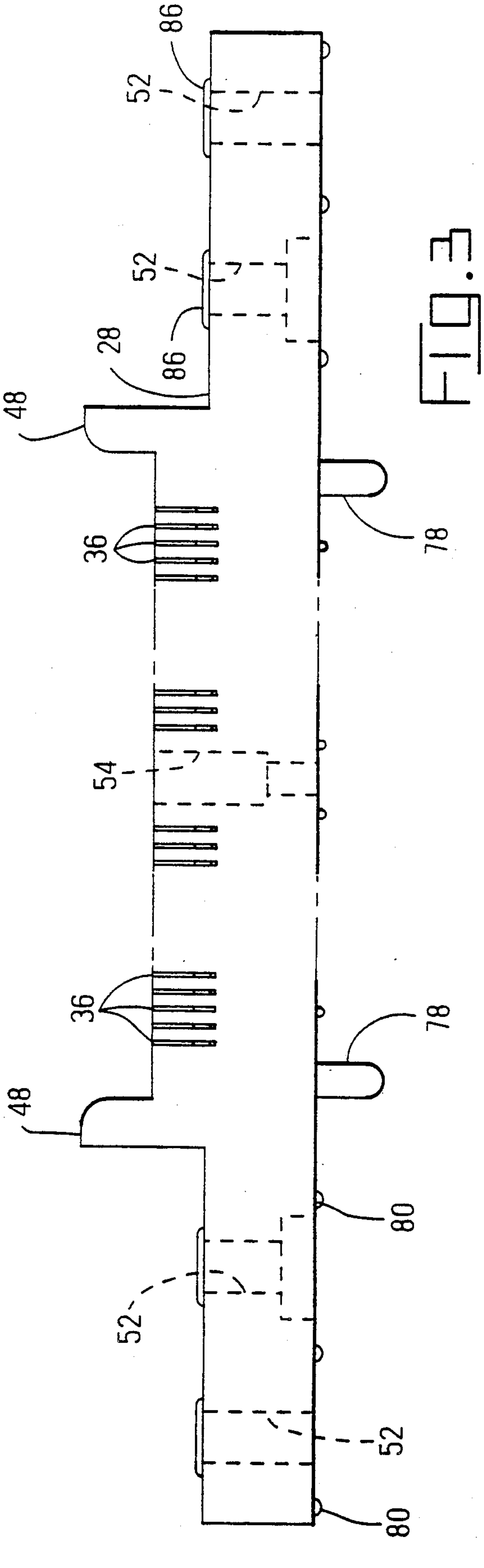
FIG. 3 is an elevational view of the connector assembly housing.
Figure 5:
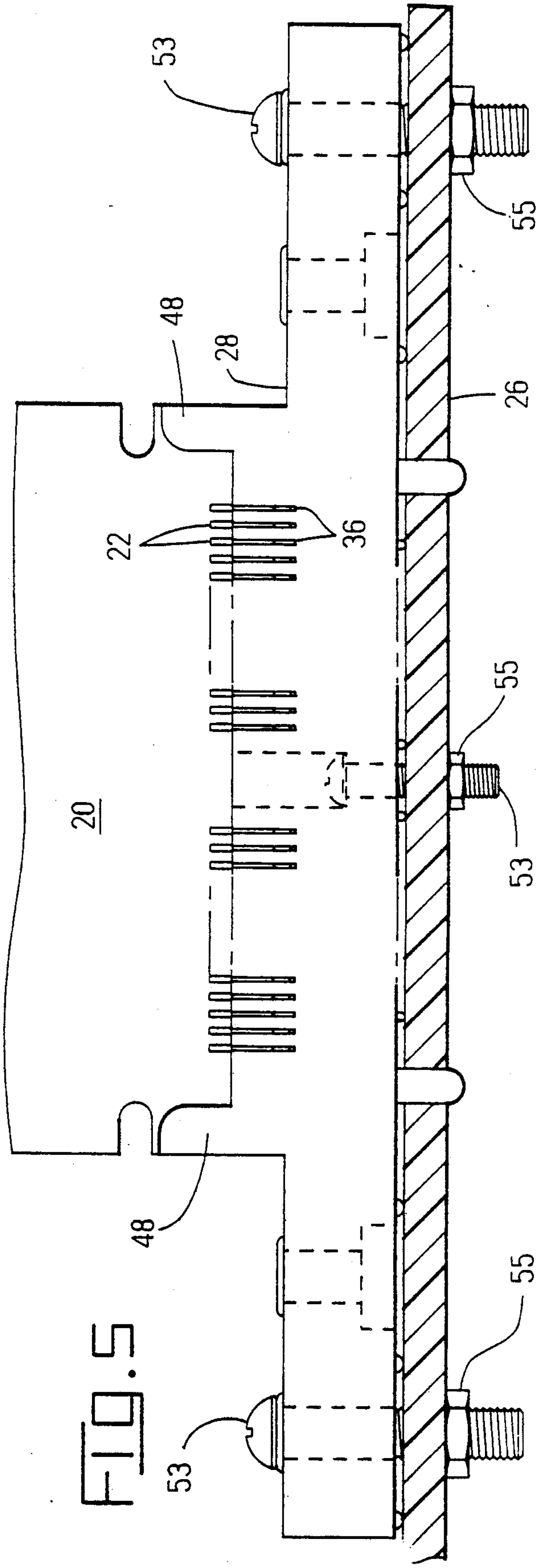
FIG. 5 is an elevational view showing the connector assembly mounted on a mother board with a daughter board in an initial stage of insertion.

As is illustrated in FIGS. 2 and 3, the board receiving cavity 38 of the housing 28 is terminated at its ends by upstanding shoulders 48, each with a channel 50 which is a vertical extension of the board receiving cavity 38 to assist in guiding the daughter board 20 for insertion into the cavity 38. The housing 28 outwardly of the shoulders 48 is provided with through-bores 52 which may be utilized for mounting the housing 28 on the mother board 26, as is shown in FIGS. 5 and 13. Additionally, a central through bore 54 is also provided for that purpose. Screws 53 extend through the bores 52, 54 and through aligned apertures in the board 26 and are then secured with nuts 55.

The housing 28 is further formed with a first plurality of apertures 56 which extend through the bottom surface 34 and intersect respective ones of the contact receiving cavities 36. The purpose of the apertures 56 is to allow the contact legs 44 to extend through the bottom surface 34 of the housing 28 when the contact members 40 are inserted in the cavities 36. The contact member 40 is also formed with a locking leg 58 and accordingly the housing 28 is formed with a second plurality of apertures 60 through its bottom surface 34 for accommodating the locking legs 58.

Figure 11:
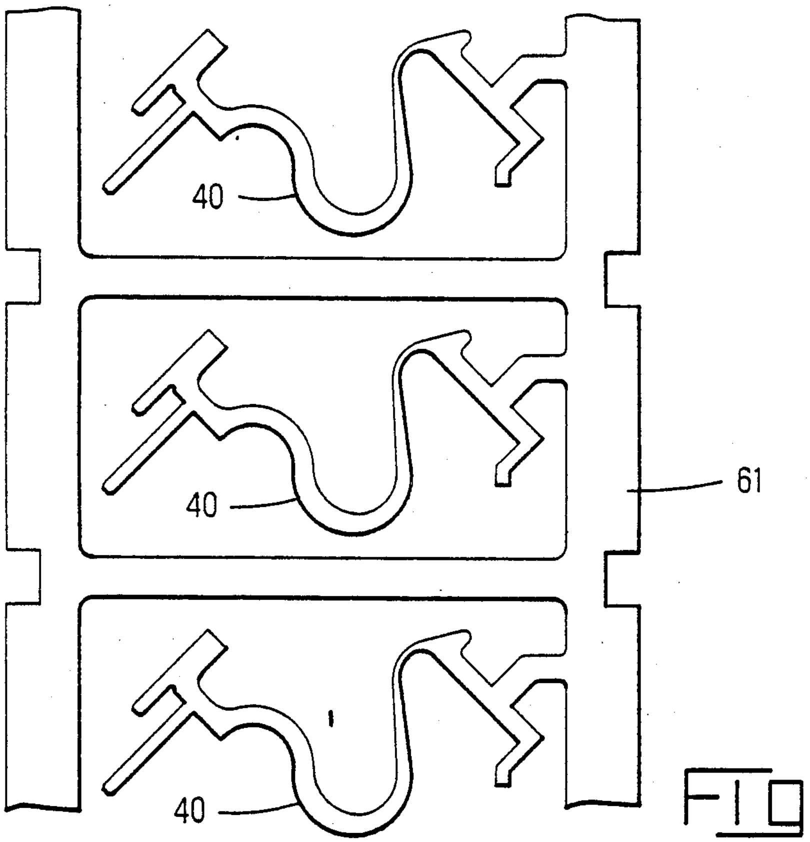
FIG. 11 illustrates a strip carrier for the contact member of FIG. 8.

The contact member 40 is preferably a stamping from relatively thin sheet material without any bending of the part. As shown in FIG. 11, before the assembly operation, the contact members 40 are held in a ladder type carrier strip 61, protecting them during handling. The surface finish on the contact portion 42 is controlled to a finer finish than the remainder of the contact member 40 to minimize friction forces during insertion of the daughter board 20. Alignment of the primary spring portion 46*a* of the contact member 40 with the material grain direction of the sheet from which it is stamped makes optimal use of the spring properties of the material.

The contact member 40 is further formed with a generally L-shaped extension 62. The side wall of the housing 28 is cut out at 64 in the cavity 36 to account for the height of the contact member 40 and allows a leg 66 of the extension 62 to extend over the side wall 68 as is clearly shown in FIG. 10. This limits movement of the contact portion 42 into the board receiving cavity 38 (FIG. 10).

Figure 12:
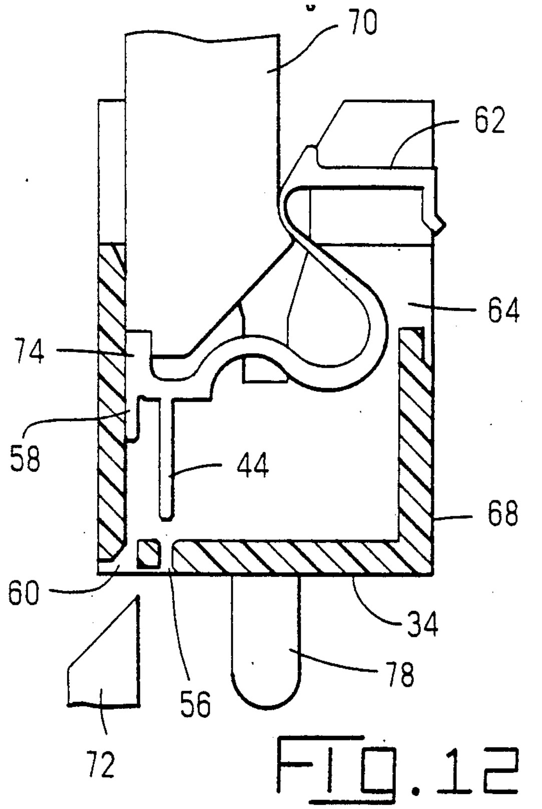
FIG. 12 illustrates the use of tools for installing a contact member in a contact receiving cavity of the inventive connector assembly.

FIG. 12 illustrates installation of the contact member 40 in a cavity 36 of the housing 28 by the use of tools 70 and 72. The contact leg 44 is inserted straight through the aperture 56, whereas the locking leg 58 extends through the aperture 60 and is then offset by the tool 72 to prevent subsequent unintended removal of the contact member 40. The raised portion 74 of the contact member 40 insures that the contact member 40 will remain attached to the tool 70 until after the locking leg 58 has been offset to lock the contact member 40 in place. Then, an upward force on the tool 70 with respect to the housing 28 will cause the contact member 40 to open up slightly, reducing its hold on the tool 70. This system is advantageous because the small deflection required of the spring portion 46 of the contact member 40 to hold it onto the tool 70 facilitates a desired preload to allow the leg 66 to be hooked over the side wall 68. Otherwise, the necessary deflection to establish this preload would have to occur as a result of interference between the contact member 40 and the daughter board 20 during insertion, thereby increasing the required insertion force and possibly causing distortion of the contact member 40.

Figure 10:
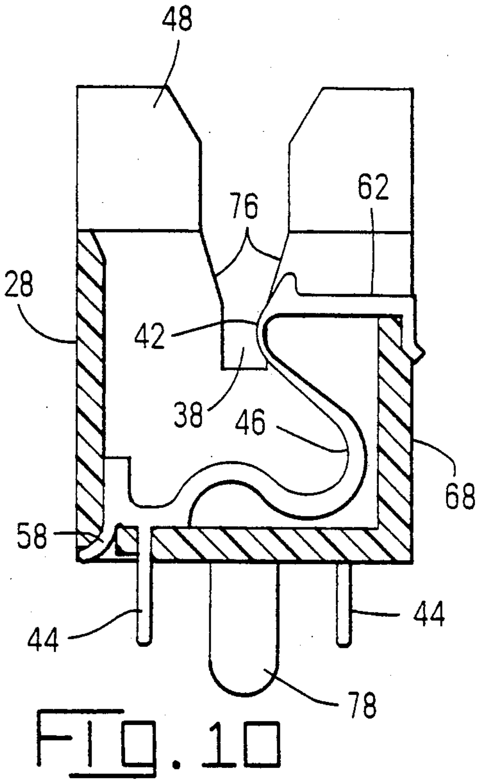
FIG. 10 is similar to FIG. 9, showing the contact member after its installation in a contact receiving cavity.

FIG. 10 illustrates the contact member 40 after insertion. As can be seen in that figure, the contact portion 42 extends into the board receiving cavity 38. A ramp 76 making up part of the side wall of the cavity 38 insures that insertion of the daughter board 20 into the cavity 38 will deflect the contact portion 42 in the proper direction. As shown by the positions of the contact legs 44 in this figure, the orientation of the contact members 40 is alternated (facing left, then facing right) along the length of the housing 28. It is further to be noted that each contact leg 44 is disposed on the opposite side of the board receiving cavity 38 and the longitudinal axis 30, from the contact portion 42. Accordingly, when the daughter board 20 is inserted in the cavity 38, the force it exerts against the contact portion 42 is transformed into a force urging the contact leg 44 toward the center of the housing 28. Since the contact members 40 alternate, this results in the contact legs 44 exerting compressive forces on the housing 28.

Figure 6:
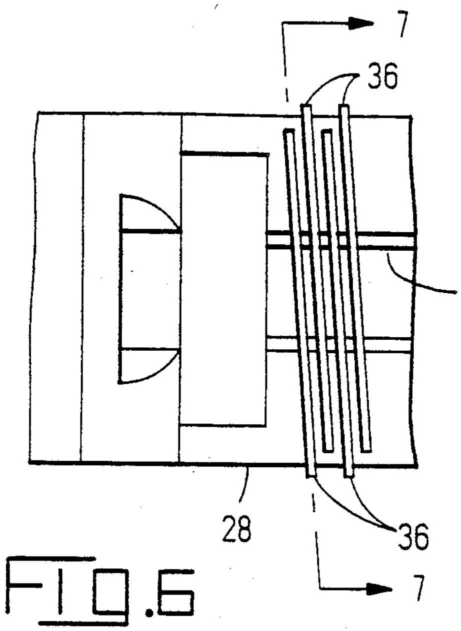
FIG. 6 is an enlarged detail taken from FIG. 2, showing contact members in place.
Figure 7:
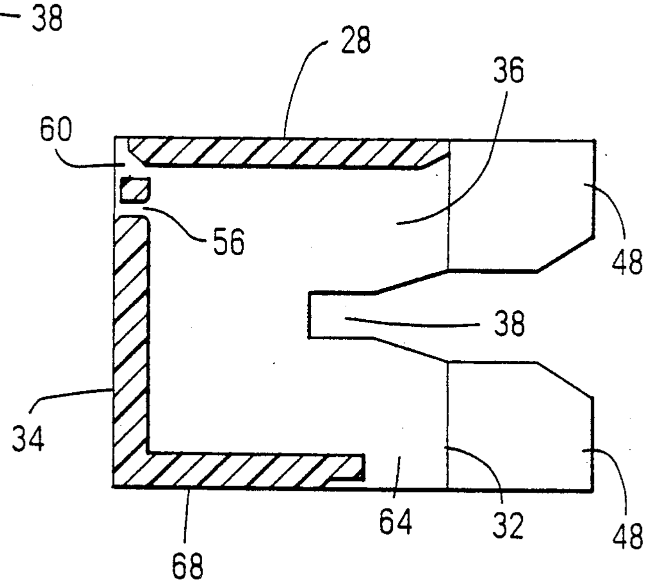
FIG. 7 is a cross sectional view taken along the line 7—7 in FIG. 6.

As is most clearly shown in FIG. 6, the contact receiving cavities 36 are angled slightly. This results in the contact portions 42 of adjacent contact members 40 being slightly more opposite one another, to insure electrical contact to the contact pads 22 on the daughter board 20 which are perfectly aligned. Furthermore, this also permits the contact legs 44 of adjacent pairs of contact members 40 to be opposite one another, thereby aiding in putting the housing into compression. Still further, this positioning of the contact legs 44 permits compatibility with typical mother board matrix hole patterns.

Figure 4:
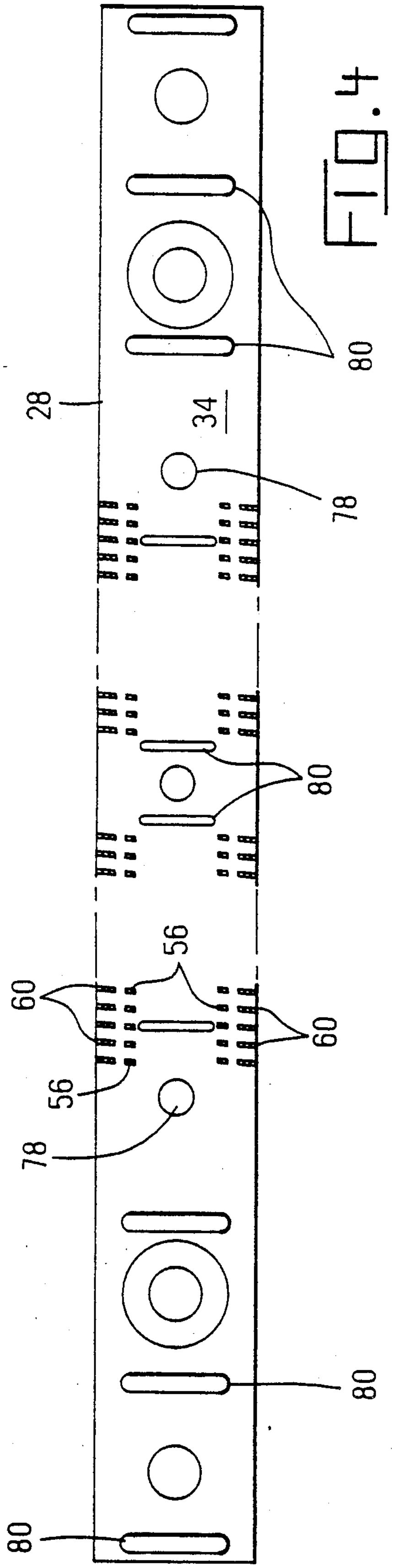
FIG. 4 is a bottom plan view of the connector assembly housing.

Returning now to a description of the housing 28, as shown in FIGS. 3 and 4, the housing 28 is provided with posts 78 for guiding the connector assembly onto the mother board 26 so that the contact legs 44 are easily inserted into respective apertures 24. As described above, screws 53 may then be inserted through appropriate ones of the apertures 52 and 54 for securely mounting the housing 28 on the mother board 26. The housing 28 is further formed with a plurality of ribs 80 on the bottom surface 34. These ribs 80 provide spacing between the bottom surface 34 and the mother board 26 to facilitate flux removal after the contact legs 44 are soldered to the respective plated apertures 24.

Figure 13A:
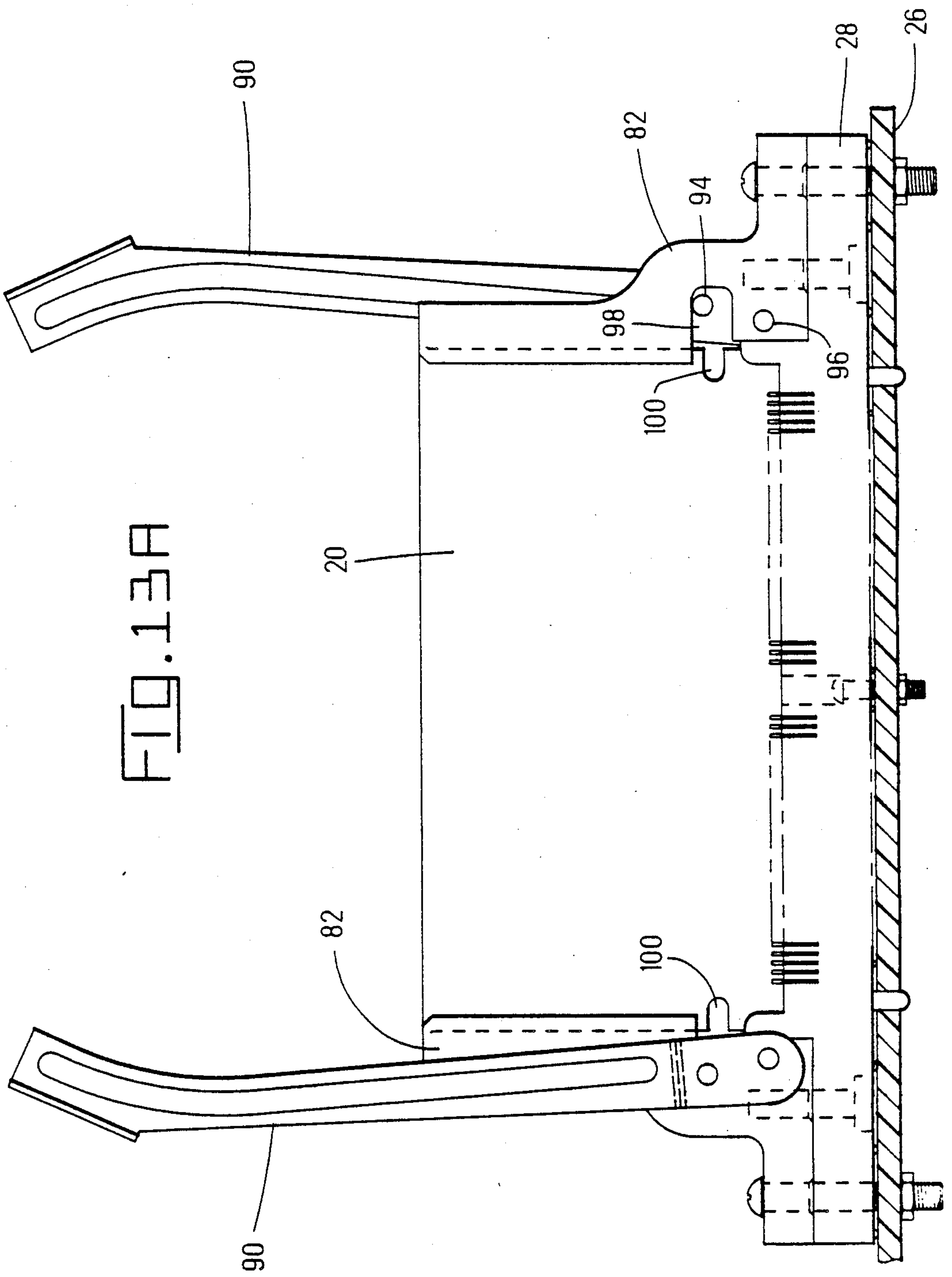
FIGS. 13A and 13B illustrate a second embodiment of a connector assembly according to this invention with the daughter board immediately prior to and after insertion, respectively.
Figure 13B:
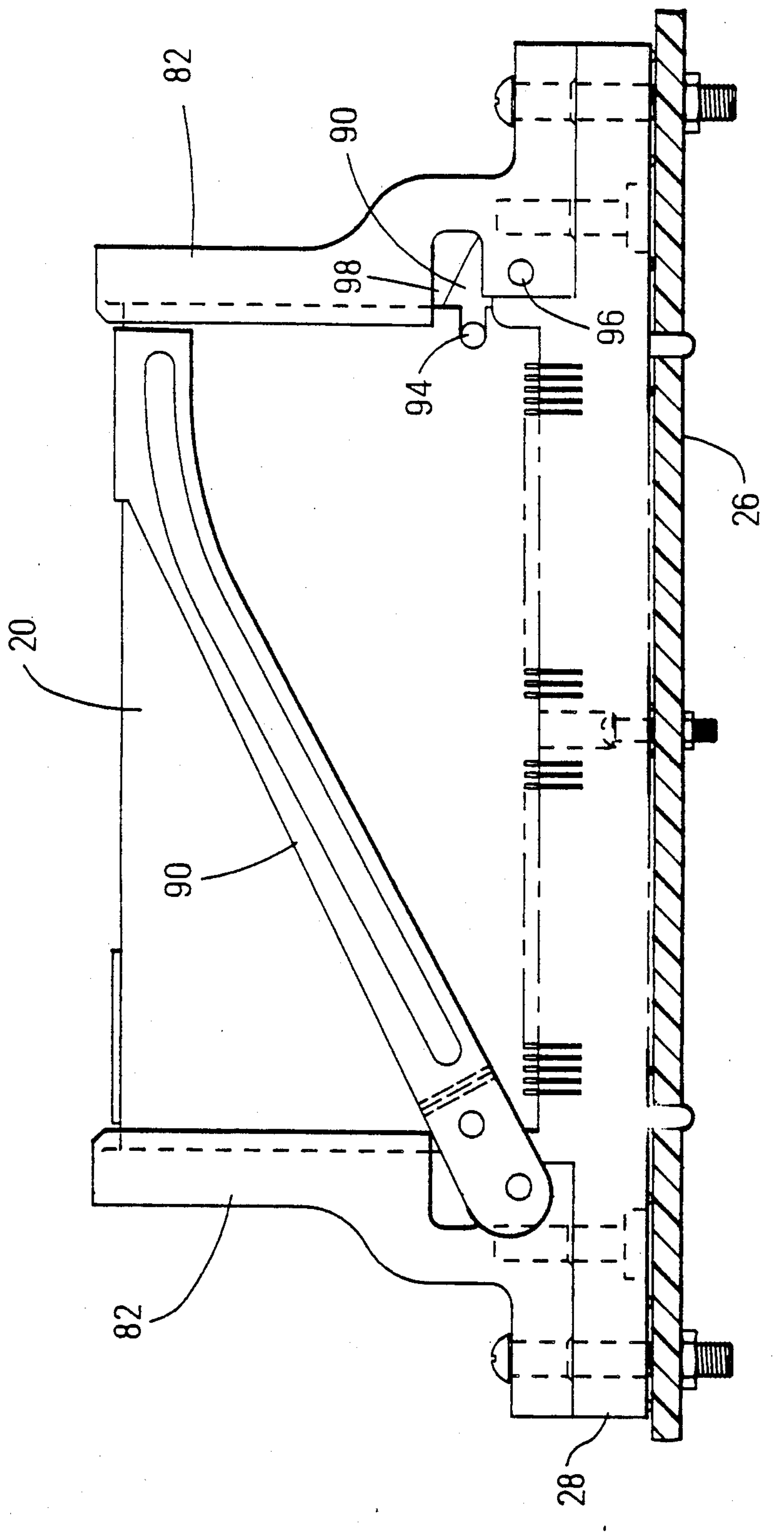

FIGS. 13A and 13B illustrate a modification of the housing 28 which incorporates the addition of structure to allow easy insertion and removal of the daughter board 20. This structure includes a pair of support members 82 mounted on the housing 28 at opposite ends of the board receiving cavity 38. Details of the support members 82 are shown in FIGS. 14A-14D. Each of the support members 82 includes a channel 84 which is an extension of the channel 50 to aid in guiding and supporting the daughter board 20. The annular ribs 86 surrounding the openings 52 in the housing 28 align with indentations 88 on the bottom of each of the supports 82 to aid in properly locating these components. Mounted on each of the support members 82 is a lever arm 90. The lever arm 90 has a pair of pins 92, 94 at one end. The pins 92, 94 extend transverse to the lever arm 90. The support 82 is formed with an opening 96 into which the pin 92 is inserted. Accordingly, the pin 92 acts as a pivot axis for the lever arm 90, which axis is transverse to the plane of the daughter board 20. The pin 94 is free to travel within the slot 98 formed in the support member 82. The daughter board 20 is formed with a pair of slots 100 extending from an edge of the daughter board 20 and transverse to the direction of movement of the daughter board 20 into and out of the board receiving cavity 38. These slots 100 cooperate with the pins 94 of the lever arms 90, as shown in FIGS. 13A and 13B, so that pivoting movement of the lever arms 90 results in an insertion or removal force being applied to the daughter board 20 through the action of the pins 94 on the walls of the slots 100. The lever arms 90 are substantially identical, with one of the lever arms 90 being formed with an offset to clear the larger components mounted on one side of the daughter board 20. The use of the lever arms 90 provides mechanical advantage and results in satisfactory "zero insertion force" operation.

There has thus been described an improved connector assembly for providing interconnections between a daughter board and a mother board. While a preferred embodiment has been disclosed, it will be apparent to one of ordinary skill in the art that various modifications and adaptations to the disclosed arrangement can be made without departing from the spirit and scope of this invention, which is only intended to be limited by the appended claims.

What is claimed is:

1. An electrical connector assembly for providing electrical connections between a plurality of contact pads (22) on a first board (20) and respective ones of a plurality of contact areas (24) on a second board (26), the assembly comprising:

an elongated dielectric housing (28) having a longitudinal axis (30), a top surface (32) and a bottom surface (34), said housing (28) being formed with a plurality of contact receiving cavities (36) extending from said top surface (32) toward said bottom surface (34) and transverse to said axis (30) and a first plurality of apertures (56) through said bottom surface (34) and each intersecting a respective one of said plurality of contact receiving cavities (36), said housing (28) being further formed with a first board receiving cavity (38) extending from said top surface (32) toward said bottom surface (34) along said axis (30) and intersecting said plurality of contact receiving cavities (36); and a plurality of contact members (40) disposed in respective ones of said plurality of contact receiving cavities (36), each of said contact members (40) arranged to engage only one side of said first board (20) and including a contact leg (44) extending through a respective one of said first plurality of apertures (56) through said bottom surface (34) of said housing (28), a contact portion (42) arranged for engagement with only one side of said first board (20) to make electrical contact with one of said plurality of contact pads (22), and a spring portion (46) between said contact leg (44) and said contact portion (42), said contact leg (44) being on the opposite side of said board receiving cavity (38) from said contact portion (42) when said contact member (40) is disposed in a respective one of said plurality of contact receiving cavities (36) so that when said first board (20) is inserted in said first board receiving cavity (38) with said one of said plurality of contact pads (22) engaging said contact portion (42) said contact leg (44) is pulled toward said first board (20), said pluarlity of contact members (40) being so oriented in said plurality of contact receiving cavities (36) that insertion of said first board (20) into said first board receiving cavity (38) results in compressive stress being induced in said housing (28) through said contact legs (44) of said plurality of contact members (40).

2. A connector assembly according to claim 1 further including means (52, 53, 54, 55) for mounting said housing (28) on said second board (26) with the contact legs (44) of said plurality of contact members (40) in engagement with respective ones of said contact areas (24).

3. A connector assembly according to claim 1 wherein said housing (28) is further formed with a second plurality of apertures (60) through said bottom surface (34) and each intersecting a respective one of said plurality of contact receiving cavities (36), each of said contact members (40) further including a locking leg (58) extending through a respective one of said second plurality of apertures (60) through said bottom surface (34) of said housing (28), each of said locking legs (58) being offset after insertion in the respective one of the second plurality of apertures (60) to inhibit removal of said contact member (40) from the respective contact receiving cavity (36).

4. connector assembly according to claim 1 wherein said first board (20) is formed with a slot (100) extending from an edge thereof and transverse to the direction of movement of said first board (20) into and out of said first board receiving cavity (38) and said connector assembly further comprises a lever arm (90) mounted on said housing (28) adjacent an end of said first board receiving cavity (38) for pivoting movement about an axis (92) transverse to the plane of the first board (20), said lever arm (90) including a pin (94) projecting from said lever arm (90) parallel to the pivot axis (92) and adapted to cooperate with said slot (100) for insertion/-removal of said first board (20) upon pivoting movement of said lever arm (90).

5. A connector assembly according to claim 1 wherein each of said contact members (40) is formed with an L-shaped extension (62) beyond said contact portion (42), a leg (66) of said extension (62) adapted to extend over a side wall (68) of said housing (28) so that interfering contact of said extension leg (66) with said side wall (68) limits movement of said contact portion (42) into said first board receiving cavity (38).

6. A connector assembly according to claim 1 wherein alternate ones of said plurality of contact members (40) are oppositely oriented.

7. A contact assembly according to claim 6, wherein each of said plurality of contact receiving cavities (36) is substantially planar, said plurality of contact receiving cavities (36) being parallel to each other and angled relative said longitudinal axis (30) so that the contact legs (44) of pairs of adjacent contact members (40) are positioned substantially in opposition across said board receiving cavity (38).

* * * * *

UNITED STATES PATENT OFFICE
CERTIFICATE OF CORRECTION

Patent No. 4,990,107 Dated February 5, 1991

Inventor(s) Jon A. Fortuna

It is certified that error appears in the above-identified patent and that said Letters Patent is hereby corrected as shown below:

In claim 4, line 12, column 8, after "4." add --A--.

Signed and Sealed this

Twenty-first Day of July, 1992

*Attest:*

DOUGLAS B. COMER

*Attesting Officer*

*Acting Commissioner of Patents and Trademarks*